(12) United States Patent
Sim et al.

(10) Patent No.: US 8,759,182 B2
(45) Date of Patent: Jun. 24, 2014

(54) MANUFACTURING METHOD FOR SEMICONDUCTOR DEVICE

(75) Inventors: Hyun-Jun Sim, Hwaseong-si (KR); Jae-Young Park, Yongin-si (KR); Hyun-Seung Kim, Bucheon-si (KR); Sang-Bom Kang, Seoul (KR); Sun-Ghil Lee, Hwaseong-si (KR); Hyun-Deok Yang, Seoul (KR); Kang-Hun Moon, Osan-si (KR); Han-Ki Lee, Hwaseong-si (KR); Sang-Mi Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 131 days.

(21) Appl. No.: 13/459,740

(22) Filed: Apr. 30, 2012

(65) Prior Publication Data

US 2012/0299154 A1 Nov. 29, 2012

(30) Foreign Application Priority Data

May 26, 2011 (KR) .................. 10-2011-0050239

(51) Int. Cl.
*H01L 21/336* (2006.01)
(52) U.S. Cl.
USPC .................. 438/287; 438/591; 257/E21.625

(58) Field of Classification Search
USPC .................................. 438/513, 528, 792
See application file for complete search history.

(56) References Cited

U.S. PATENT DOCUMENTS

| | | | |
|---|---|---|---|
| 6,790,755 B2 * | 9/2004 | Jeon | 438/591 |
| 7,429,538 B2 | 9/2008 | Olsen | |
| 7,429,540 B2 | 9/2008 | Olsen | |
| 7,494,940 B2 * | 2/2009 | Doh et al. | 438/785 |
| 2010/0323531 A1 | 12/2010 | Honda et al. | |

\* cited by examiner

*Primary Examiner* — Chandra Chaudhari
(74) *Attorney, Agent, or Firm* — Onello & Mello, LLP

(57) ABSTRACT

A semiconductor device having an improved negative bias temperature instability lifetime characteristic is manufactured by forming a first insulating layer on a substrate, performing a first nitridation on the first insulating layer to form a second insulating layer, and sequentially performing a first and second anneal on the second insulating layer to form a third insulating layer, wherein the second anneal is performed at a higher temperature and with a different gas than the first anneal. A second nitridation is performed on the third insulating layer to form a fourth insulating layer, and a sequential third and fourth anneal on the fourth insulating layer forms a fifth insulating layer. The third anneal is performed at a higher temperature than the first anneal, and the fourth anneal is performed at a higher temperature than the second anneal and with a different gas than the third anneal.

15 Claims, 11 Drawing Sheets

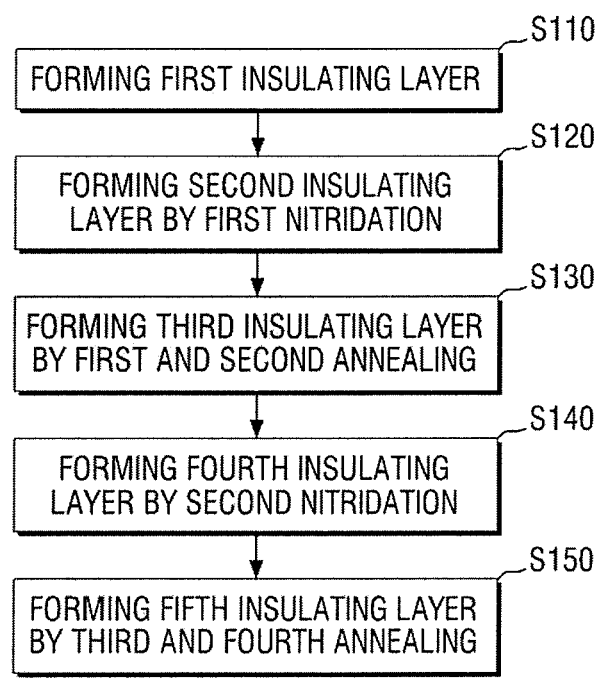
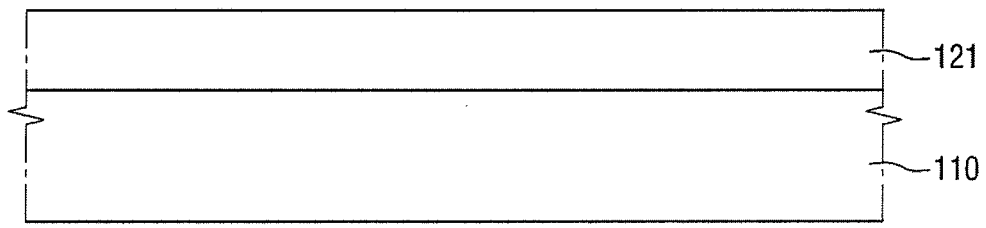

FIG.6
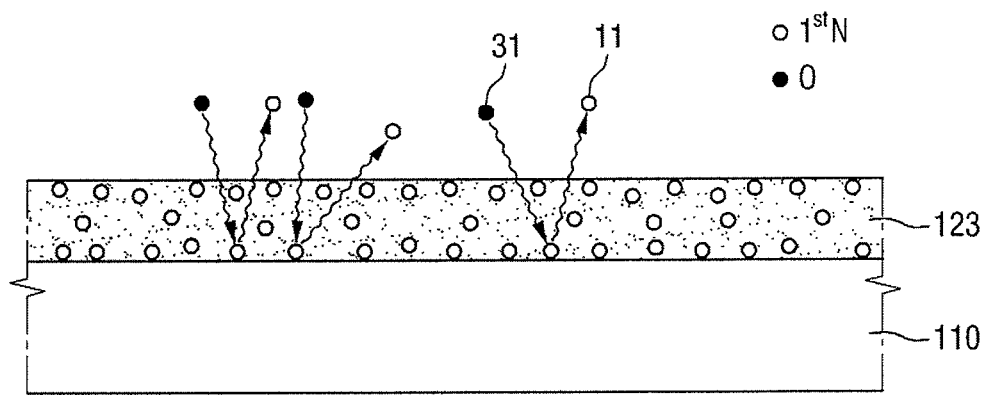
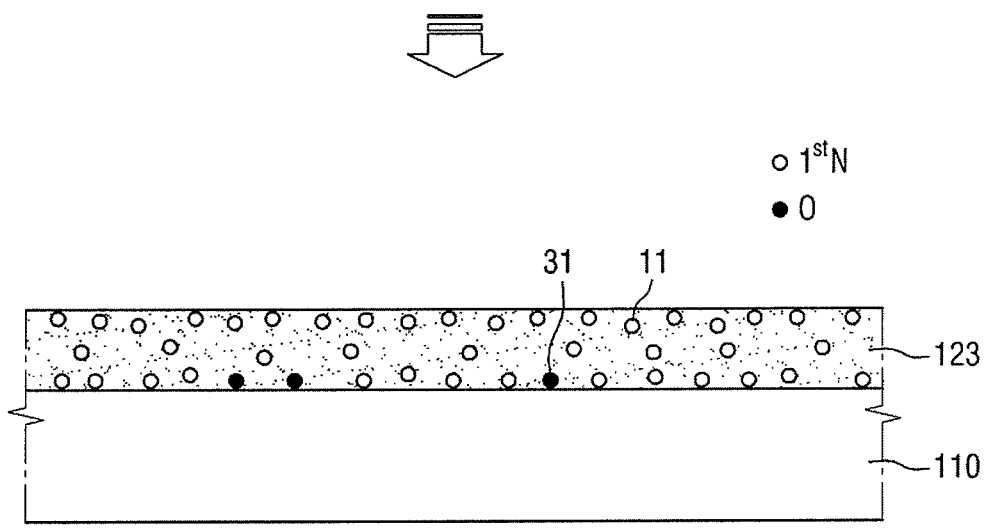
FIG.7
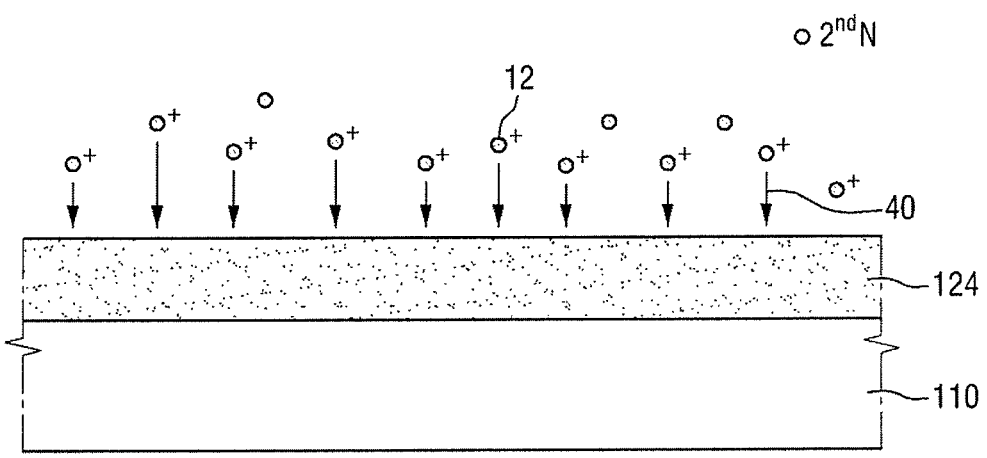

MANUFACTURING METHOD FOR SEMICONDUCTOR DEVICE

CROSS-REFERENCE TO RELATED APPLICATION

This application claims priority from Korean Patent Application No. 10-2011-0050239 filed on May 26, 2011, in the Korean Intellectual Property Office, and all the benefits accruing therefrom under 35 U.S.C. 119, the contents of which in its entirety are herein incorporated by reference.

BACKGROUND

1. Field

Embodiments of the present inventive concepts relate to a manufacturing method for a semiconductor device, and more particularly to a manufacturing method for a semiconductor device having an improved negative bias temperature instability (NBTI) lifetime characteristic.

2. Description of the Related Art

With the recent trend toward highly integrated semiconductor devices, the size of a semiconductor device is gradually scaled down, leading to an increasing demand for low-power, high-speed transistors. Low-power and high-speed operation in a transistor can be achieved using a gate insulating layer. In particular, reducing gate thickness and securing a negative bias temperature instability (NBTI) lifetime characteristic typically are quite important.

In non-memory and memory device below 60-nm scale, a silicon oxynitride layer (SiON) may be used as a gate insulating layer. In order to reduce the electric thickness of the SiON gate insulating layer and improve the NBTI lifetime, the position and concentration of nitrogen in the SiON gate insulating layer is controlled.

SUMMARY

A manufacturing method for producing a semiconductor device having an improved negative bias temperature instability (NBTI) lifetime characteristic by controlling the position of nitrogen atoms in a gate insulating layer is described herein.

According to an aspect of the present inventive concepts, a method for manufacturing a semiconductor device includes forming a first insulating layer on a substrate. A second insulating layer is formed by performing a first nitridation (implantation of nitrogen atoms) on the first insulating layer. A third insulating layer is then formed by sequentially performing a first anneal and a second anneal on the second insulating layer, wherein the first anneal is performed at a first temperature with a stream of a first gas, and wherein the second anneal is performed at a second temperature higher than the first temperature with a stream of a second gas different from the first gas. A fourth insulating layer is then formed by performing a second nitridation on the third insulating layer. Next, a fifth insulating layer is formed by sequentially performing a third anneal and a fourth anneal on the fourth insulating layer, wherein the third anneal is performed at a third temperature higher than the first temperature with a stream of a third gas, and wherein the fourth annealing is performed at a fourth temperature higher than the second temperature with a stream of a fourth gas different from the third gas.

In some embodiments, the fifth insulating layer includes a first region and a second region, the first region contacting at least one surface of the fifth insulating layer and having a smaller number of nitrogen atoms than the second region.

In some embodiments, the fifth insulating layer includes a first region and a second region, the first region positioned closer to the substrate than the second region and having a smaller number of nitrogen atoms than the second region.

In some embodiments, the number of nitrogen atoms existing in the fifth insulating layer gradually increases with increasing distance from the substrate.

In some embodiments, the first insulating layer is a stacked layer of an oxide layer and a high-k layer, and wherein the first nitridation, the first anneal and the second anneal, the second nitridation, the third anneal and the fourth anneal are performed on the stacked layer.

In some embodiments, the manufacturing method further comprises forming a high-k layer on the fifth insulating layer.

In some embodiments, the manufacturing method further comprises implanting nitrogen into the high-k layer.

In some embodiments, the manufacturing method further comprises performing the first nitridation, the first anneal, the second anneal, the second nitridation, the third anneal, and the fourth anneal on the high-k layer.

In some embodiments, the stream of the second gas and the stream of the fourth gas contain oxygen.

In some embodiments, the first nitridation and the second nitridation are performed by plasma nitridation, and wherein the plasma nitridation in the second nitridation is performed with higher energy than in the first nitridation.

In some embodiments, the first anneal and the second anneal are in-situ performed, and the third anneal and the fourth anneal are also in-situ performed.

According to another aspect of the present inventive concepts, a method for manufacturing a semiconductor device includes forming an oxide layer on a substrate. A first nitride layer is then formed by performing a first nitridation on the oxide layer. Then, a second nitride layer is formed by sequentially performing a first anneal and a second anneal on the first nitride layer, wherein the first anneal is performed at a first temperature with a stream of a first gas, and wherein the second anneal is performed at a second temperature higher than the first temperature with a stream of a second gas different from the first gas. A gate insulating layer is formed by repeatedly performing a second nitridation, a third anneal and a fourth anneal on the second nitride layer one or more times; and a gate electrode is formed on the gate insulating layer.

In some embodiments, a nitrogen concentration of the gate insulating layer becomes smallest at an interface between the gate insulating layer and the substrate.

In some embodiments, the oxide layer is a stacked layer in which a high-k layer is stacked on the oxide layer, and wherein the gate insulating layer is formed by performing the first nitridation, the first anneal, the second anneal, the second nitridation, the third anneal, and the fourth anneal on the stacked layer.

In some embodiments, the manufacturing method further comprises forming a high-k layer on the gate insulating layer after the forming of the gate insulating layer and before the forming of the gate electrode.

According to another aspect of the present inventive concepts, a semiconductor device comprises: a substrate; an insulating layer formed on the substrate, wherein the insulating layer forms an interface with the substrate and has a center midway across the insulating layer from the interface; nitrogen atoms implanted in the insulating layer, wherein the concentration of nitrogen atoms decreases with proximity to the interface over a majority of the distance from the center of the insulating layer to the interface. atoms of a second element distinct from nitrogen implanted in the insulating layer, wherein the concentration of the second-element atoms increases with proximity to the interface over a majority of the distance from the center of the insulating layer to the interface.

In some embodiments, the second element is oxygen.

In some embodiments, the substrate comprises silicon.

In some embodiments, the insulating layer comprises a silicon oxide.

In some embodiments, the insulating layer comprises at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

BRIEF DESCRIPTION OF THE DRAWINGS

The above and other features and advantages of the present inventive concepts will become more apparent from the following detailed description of embodiments thereof with reference to the attached drawings in which:

FIG. 1 is a flowchart of a method for manufacturing a semiconductor device according to an embodiment of the present inventive concepts;

FIGS. 2 to 11 are cross-sectional views illustrating process steps in the method for manufacturing a semiconductor device according to an embodiment of the present inventive concepts;

DETAILED DESCRIPTION OF EMBODIMENTS

Figure 3:
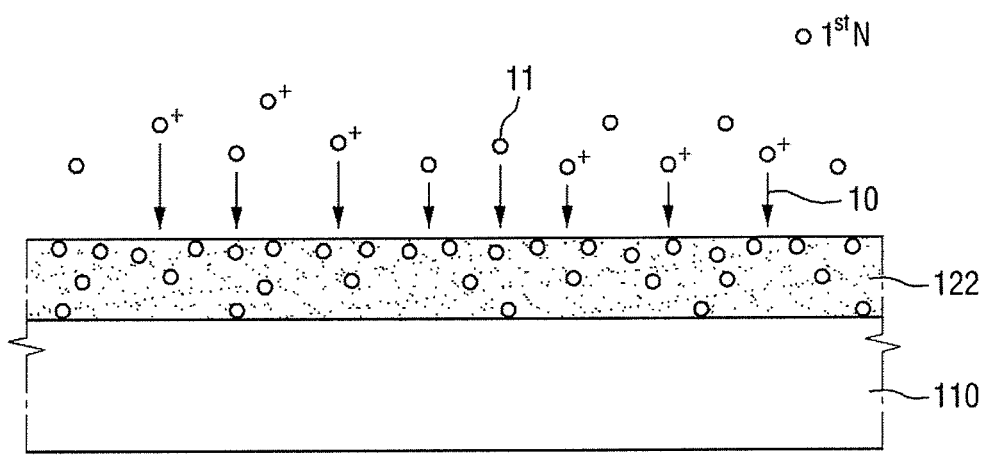

Embodiments of the present inventive concepts will now be described more fully hereinafter with reference to the accompanying drawings, in which various embodiments are shown. This inventive concepts may, however, be embodied in different forms and should not be construed as limited to the embodiments set forth herein. Rather, these embodiments are provided so that this disclosure will be thorough and complete, and will fully convey the scope of the inventive concepts to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term, "below," can encompass both an orientation of above and below. The device may be otherwise oriented (rotated 90 degrees or at other orientations) and the spatially relative descriptors used herein interpreted accordingly.

The use of the terms, "a," "an," "the" and similar referents, in the context of describing the inventive concepts (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which the inventive concepts pertain. It is noted that the use of any and all examples, or exemplary terms provided herein is intended merely to better illuminate the inventive concepts and is not a limitation on the scope unless otherwise specified. Further, unless defined otherwise, all terms defined in generally used dictionaries may not be overly interpreted.

Embodiments of the present inventive concepts will be described with reference to perspective views, cross-sectional views, and/or plan views. Thus, the profile of an exemplary view may be modified according to manufacturing techniques and/or allowances. That is, the embodiments that are described and illustrated are not intended to limit the scope of the present inventive concepts but cover all changes and modifications that can be caused due to a change in manufacturing process. Thus, regions shown in the drawings are illustrated in schematic form and the shapes of the regions are presented simply by way of illustration and not as a limitation.

Hereinafter, exemplary embodiments of the present inventive concepts will be described with reference to the accompanying drawings.

Figure 12:
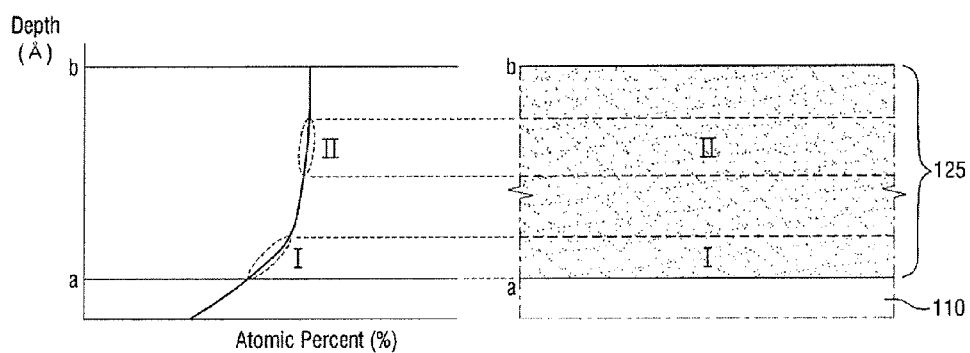
FIGS. 12 and 13 illustrate distributions of nitrogen atoms in a fifth insulating layer formed according to an embodiment of the present inventive concepts.
Figure 13:
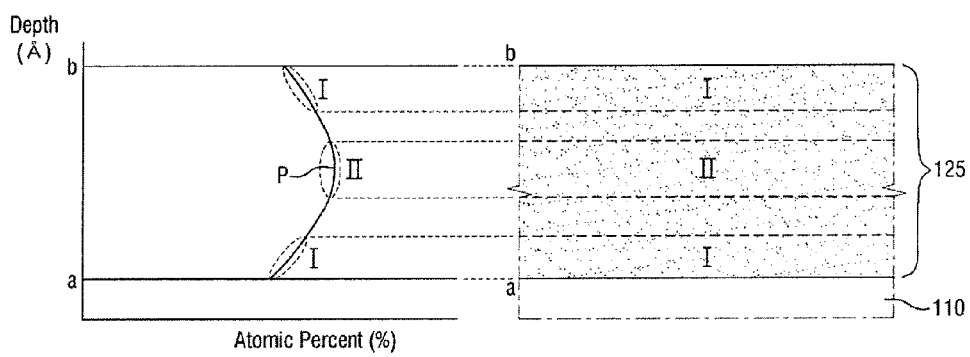

First, a method for manufacturing a semiconductor device according to an embodiment of the present inventive concepts will be described with reference to the accompanying drawings with reference to FIGS. 1 to 13. FIG. 1 is a flowchart of a method for manufacturing a semiconductor device according to an embodiment of the present inventive concepts, FIGS. 2 to 11 are cross-sectional views illustrating process steps in the method for manufacturing a semiconductor device according to an embodiment of the present inventive concepts, and FIGS. 12 and 13 illustrate distributions of nitrogen atoms in a fifth insulating layer formed according to an embodiment of the present inventive concepts.

Referring first to FIGS. 1 and 2, a first insulating layer 121 is formed on a substrate 110 (S110).

The substrate 110 may include a silicon substrate, a silicon on insulator (SOI) substrate, a gallium arsenic semiconductor substrate, a silicon germanium semiconductor substrate, a ceramic semiconductor substrate, a quartz semiconductor substrate, or a glass semiconductor substrate for a display, but not limited thereto.

The first insulating layer 121 may be a silicon oxide layer or a high-dielectric-constant (high-k) layer.

The silicon oxide layer may be formed by thermally oxidizing a predetermined region of the substrate 110 from a surface of the substrate 110. In detail, the silicon oxide layer may be formed by performing rapid thermal oxidation on the substrate 110 at a temperature in a range of approximately 700° C. to approximately 1100° C. The thermal oxidation may be performed with a stream of oxygen, which is created by injecting hydrogen peroxide ($H_2O_2$), ozone ($O_3$) or $H_2O$, for example.

The silicon oxide layer may also be formed by treating the substrate 110 with a chemically active material. For example, if the substrate 110 is treated with a solution containing an oxygen source material and ammonia ($NH_3$), a predetermined region of the substrate 110 is oxidized by the oxygen source material, thereby forming the silicon oxide layer. Here, hydrogen peroxide ($H_2O_2$) may be used as the oxygen source material, though the oxygen source material is not limited thereto.

Alternatively, the silicon oxide layer may be formed by an atomic layer deposition (ALD) or a chemical vapor deposition (CVD) process. Here, non-limiting examples of the silicon source gas may include $SiH_4$, $SiH_2Cl_2$, $SiHCl_3$, $SiCl_4$, $Si(OC_4H_3)_4$, $Si(OCH_3)_4$ or $Si(OC_2H_5)_4$, either alone or as a mixture thereof. In addition, non-limiting examples of the oxygen source gas may include $H_2O$, $O_2$, $O_3$, O radical, alcohol, or $H_2O_2$, either alone or as a mixture thereof.

In detail, the high-k layer may include, for example, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate, either alone or as a mixture thereof, though the high-k layer is not limited thereto. Where a high-k layer is used, a sufficiently high dielectric constant can be achieved, thereby reducing the thickness of the first insulating layer 121. The high-k layer may be formed by an ALD or CVD process.

The silicon oxide layer or the high-k layer may have a single- or multiple-layered structure including the above stated layers, and the structure type or thickness of the silicon oxide layer or the high-k layer may be arbitrarily adjusted by one skilled in the relevant art.

Next, referring to FIGS. 1 and 3, a second insulating layer 122 is formed by performing a first implantation 10 of a first group of nitrogen atoms 11 (i.e., a first nitridation) into the first insulating layer 121 (S120). The second insulating layer 122 may have an increased dielectric constant as the first group of nitrogen atoms 11 is implanted.

The first implantation 10 may be performed by plasma treatment or by rapid thermal annealing and under a condition in which a relatively large amount of the first group of nitrogen atoms 11 is distributed around a top surface of the first insulating layer 121. For example, in a case of plasma treatment, a nitrogen source gas is implanted and power in a range of 400 W to 600 W is applied with a pressure in a range of 10 mTorr to 30 mTorr, thereby nitridating the first insulating layer 121. In a case of rapid thermal annealing, nitrogen source gas is implanted and an annealing process is performed at a temperature in a range of 500° C. to 100° C. for 10 to 30 seconds, thereby nitridating the first insulating layer 121. Here, non-limiting examples of the nitrogen source gas may include a gas such as $N_2$, $NH_3$, $N_2O$, NO, a mixed gas containing the nitrogen source gas, halogen, or an oxygen containing gas.

In the first implantation 10, the first group of nitrogen atoms 11 may be in the form of free nitrogen or nitrogen ions. The first group of nitrogen atoms 11 may break weak bonds (e.g., O—Si bonds) in the first insulating layer 121 and combine with Si instead of oxygen-forming N—Si bonds, or may be combined with dangling bonds in the first insulating layer 121, thereby forming silicon oxynitride.

Referring to FIG. 1 and FIGS. 4 to 6, a third insulating layer 123 is formed by sequentially performing the first anneal 20 and the second anneal 30 on the second insulating layer 122 (S130).

The first anneal 20 may be performed at a first temperature with a stream of a first gas. For example, the first anneal 20 may be performed at a temperature in a range of approximately 700° C. to approximately 1000° C. with a stream of nitrogen-containing gas. Here, non-limiting examples of the nitrogen-containing gas may include $N_2O$ or NO gas.

Figure 4:
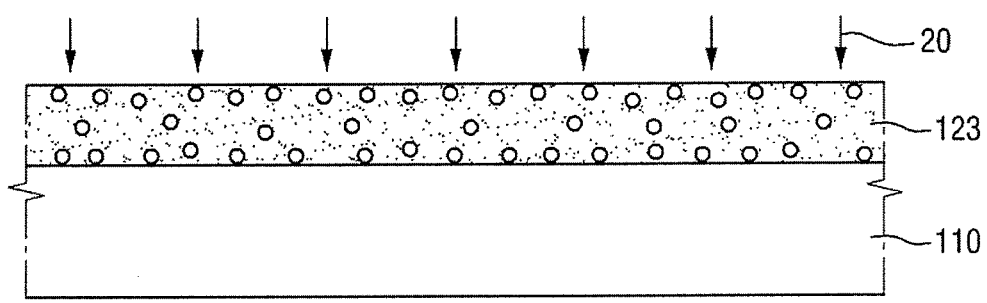

Referring to FIG. 4, the first group of nitrogen atoms 11 is uniformly distributed in the third insulating layer 123 by the first anneal 20. In addition, N—Si bonds formed by performing the first implantation 10 are stabilized while reducing the dangling bonds. That is to say, the first anneal 20 may cure defects of the second insulating layer 122 generated as a result of the first implantation 10.

The second anneal 30 may be performed at a second temperature with a stream of a second gas. The second gas may be different from the first gas, and the second temperature may be higher than the first temperature. For example, the second anneal 30 may be performed at a second temperature in a range of approximately 900° C. to approximately 1100° C. with a stream of oxygen-containing gas. Here, non-limiting examples of the oxygen-containing gas may include $O_2$, $O_3$, $D_2O$ gas or a mixture of one or more of these gases with or without $H_2$.

The first anneal 20 and the second anneal 30 may be in-situ performed. After performing the first anneal 20, the second anneal 30 may be consecutively performed in the same chamber while varying implanted gases without air break.

Figure 5:
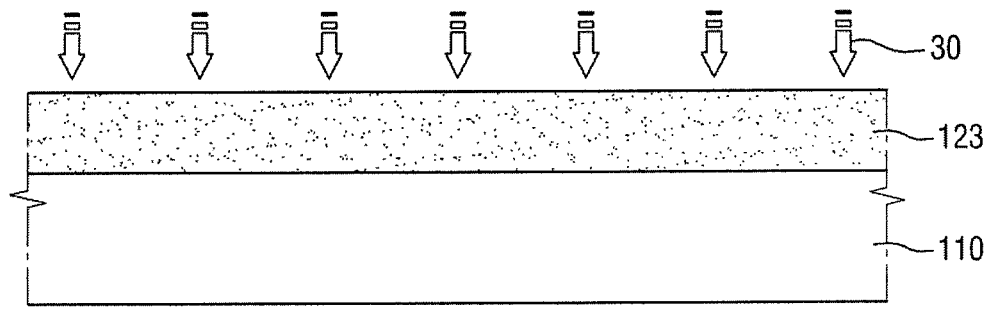

Referring to FIGS. 5 and 6, oxygen atoms 31 are implanted into the second insulating layer 122 by the second anneal 30. The oxygen atoms 31 are implanted to reach an interface region between the substrate 110 and the second insulating layer 122, thereby oxidizing the interface between the substrate 110 and the second insulating layer 122. Here, the oxygen atoms 31 discharge the first group of nitrogen atoms 11 positioned at the interface region between the substrate 110 and the second insulating layer 122 to the outside. Thus, the number of the nitrogen atoms 11 positioned at the interface region between the substrate 110 and the second insulating layer 122 may be reduced.

Figure 8:
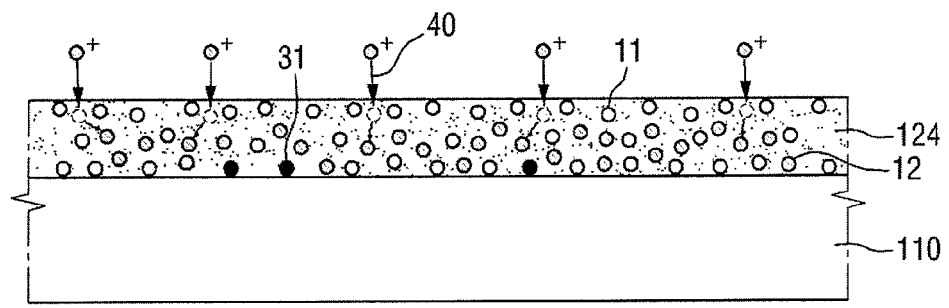
Figure 9:
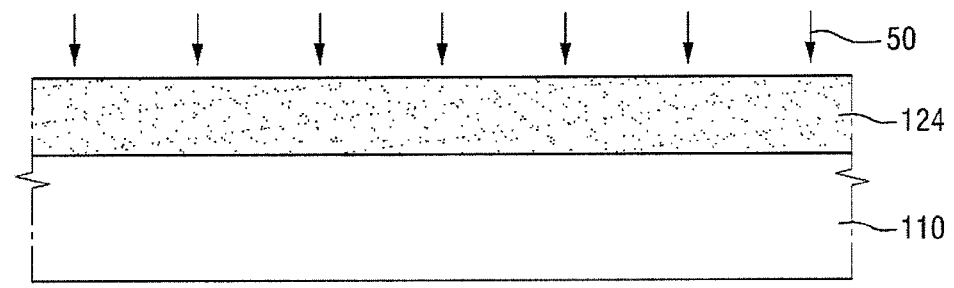
Figure 10:
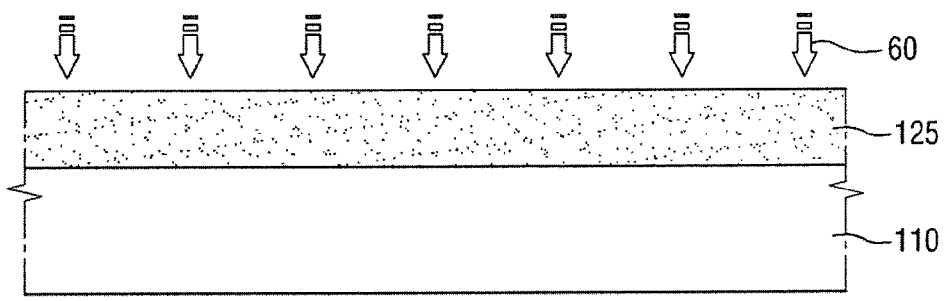

Next, referring to FIG. 1 and FIGS. 7 and 8, a fourth insulating layer 124 is formed by performing a second implantation 40 of a second group of nitrogen atoms 12 into the third insulating layer 123 (S140).

The second implantation 40 may be performed by plasma treatment or rapid thermal annealing. In order to implant nitrogen atoms until a desired nitrogen concentration is achieved, the second implantation 40 may be performed in a more stringent condition than the first implantation 10. For example, where plasma treatment is used, nitrogen source gas can be implanted and power in a range of 1500 W to 2000 W can be applied with a pressure in a range of 10 mTorr to 30 mTorr, thereby nitridating the third insulating layer 123 and forming a fourth insulating layer 124.

The process of implanting the second group of nitrogen atoms 12 will now be described in more detail with reference to FIG. 8. As a result of the first implantation 10, the first group of nitrogen atoms 11 are positioned in the vicinity of a top surface of the third insulating layer 123. The first group of nitrogen atoms 11 positioned in the vicinity of the top surface of the third insulating layer 123 obstruct implantation paths of the second group of nitrogen atoms 12. Since the implantation paths of the second group of nitrogen atoms 12 are obstructed by the first group of nitrogen atoms 11, the likelihood of nitrogen atoms 12 from the second group reaching the interface between the substrate 110 and the third insulating layer 123 is reduced. In addition, when the second group of nitrogen atoms 12 are implanted, they may collide nitrogen atoms 11 from the first group positioned in the vicinity of the top surface of the third insulating layer 123, so that nitrogen atoms 11 from the first group move while preventing the second group of nitrogen atoms 12 from moving further. Therefore, the number of the nitrogen atoms 11 and 12 positioned at the interface between the substrate 110 and the fourth insulating layer 124 can be reduced.

Referring to FIG. 1 and FIGS. 9 to 11, a fifth insulating layer 125 is formed by sequentially performing the third anneal 50 and the fourth anneal 60 on the fourth insulating layer 124 (S150).

The third anneal 50 may be performed at a third temperature that is higher than the first temperature with a stream of a third gas. For example, the third anneal 50 may be performed at a temperature in a range of approximately 700° C. to approximately 1100° C. with a stream of nitrogen-containing gas.

The third anneal 50 may stabilize the second group of nitrogen atoms 12 implanted through the second implantation 40 and may cure defects in the fourth insulating layer 124 generated as the result of the second implantation 40.

The fourth anneal 60 may be performed at a fourth temperature higher than the second temperature with a stream of a fourth gas. For example, the fourth annealing may be performed at a temperature in a range of approximately 1000° C. to 1200° C. with a stream of oxygen-containing gas.

Figure 11:
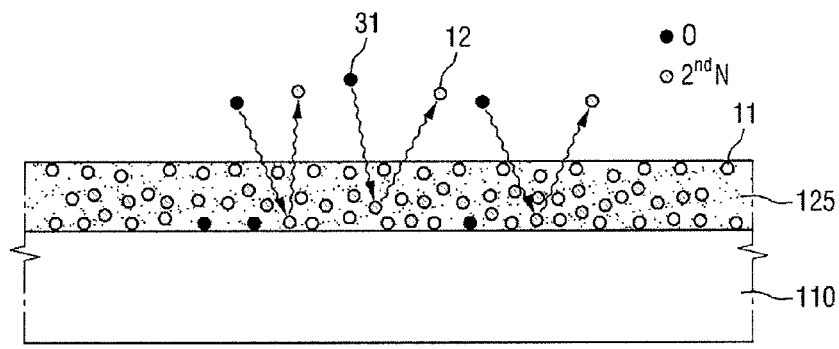

Referring to FIG. 11, the fourth insulating layer 124 is oxidized during the fourth anneal 60. The oxygen atoms 31 are implanted to an interface region between the substrate 110 and the fourth insulating layer 124, and the interface region between the substrate 110 and the fourth insulating layer 124 is oxidized. Meanwhile, nitrogen atoms 11 from the first group or nitrogen atoms 12 from the second group positioned at the interface between the substrate 110 and the fourth insulating layer 124 are discharged to the outside by the oxygen atoms 11 implanted during the fourth anneal 60. Thus, the number of the nitrogen atoms 11 from the first group or the nitrogen atoms 12 from the second group positioned at the interface region between the substrate 110 and the fifth insulating layer 125 may be reduced.

Hereinafter, distributions of nitrogen atoms in the fifth insulating layer 125 formed according to an embodiment of the present inventive concepts will be described with reference to FIGS. 12 and 13. FIGS. 12 and 13 illustrate distributions of nitrogen atoms depending on the depth of the fifth insulating layer 125. However, the present inventive concepts do not limit the distributions of nitrogen atoms in the fifth insulating layer 125 to the illustrated examples. The nitrogen atoms include both nitrogen atoms 11 from the first group and nitrogen atoms 12 from the second group. In FIGS. 12 and 13, reference symbol "a" denotes a bottom surface of the fifth insulating layer 125, and reference symbol "b" denotes a top surface of the fifth insulating layer 125. In addition, "a" may coincide with the interface between the substrate 110 and the fifth insulating layer 125. The fifth insulating layer 125 includes a first region I and a second region II positioned on the first region I. The first region I may be positioned closer to the substrate 110 than to the second region II, and the first region I may contact "a," Here, the first region I includes a smaller number of nitrogen atoms than the second region II. That is to say, the number of nitrogen atoms in the fifth insulating layer 125 tends to decrease toward the "a" interface. Thus, the number of nitrogen atoms in the fifth insulating layer 125 becomes smallest at the bottom surface of the fifth insulating layer 125—that is, at the interface between the substrate 110 and the fifth insulating layer 125.

Referring back to FIG. 13, the fifth insulating layer 125 includes a first region I contacting any one surface "a" or "b" of the fifth insulating layer 125, and a second region II. Here, the number of nitrogen atoms in the first region I is smaller than the number of nitrogen atoms in the second region II. That is to say, a peak "P" (at which the number of nitrogen atoms is the maximum) is generated in the fifth insulating layer 125. The number of nitrogen atoms at the peak P is larger than the number of nitrogen atoms at the surface "a" or "b".

As described above, the number of nitrogen atoms in the fifth insulating layer 125 formed according to this embodiment decreases toward the interface between the fifth insulating layer 125 and the substrate 110. If the nitrogen atoms are heavily distributed at the interface, dangling defects may be caused, thereby increasing the threshold voltage of the semiconductor device and lowering the NBTI lifetime characteristic. The semiconductor device manufactured according to this embodiment has a reduced number of nitrogen atoms at the interface between the substrate 110 and the fifth insulating layer 125, thereby providing for an improved NBTI lifetime characteristic.

Figure 14:
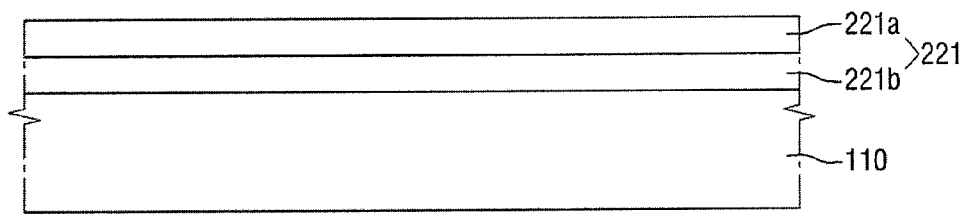
FIGS. 14 to 16 are cross-sectional views illustrating process steps in the method for manufacturing a semiconductor device according to another embodiment of the present inventive concepts.
Figure 15:
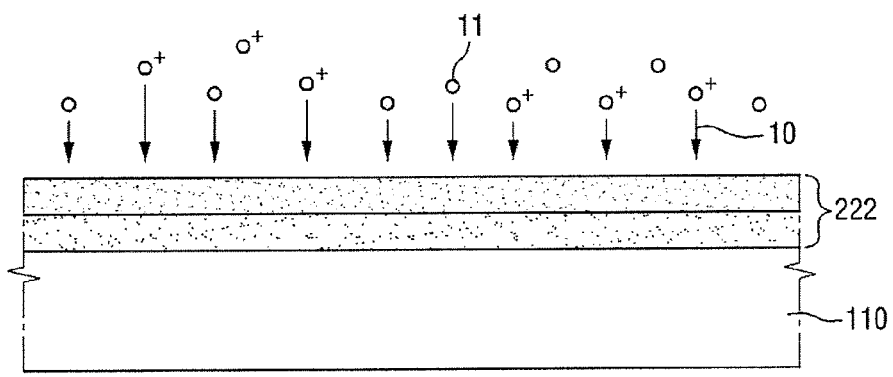
Figure 16:
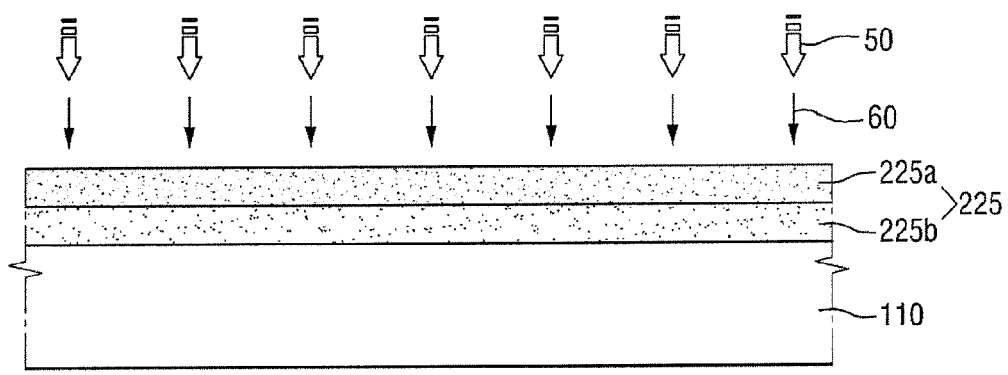
Figure 17:
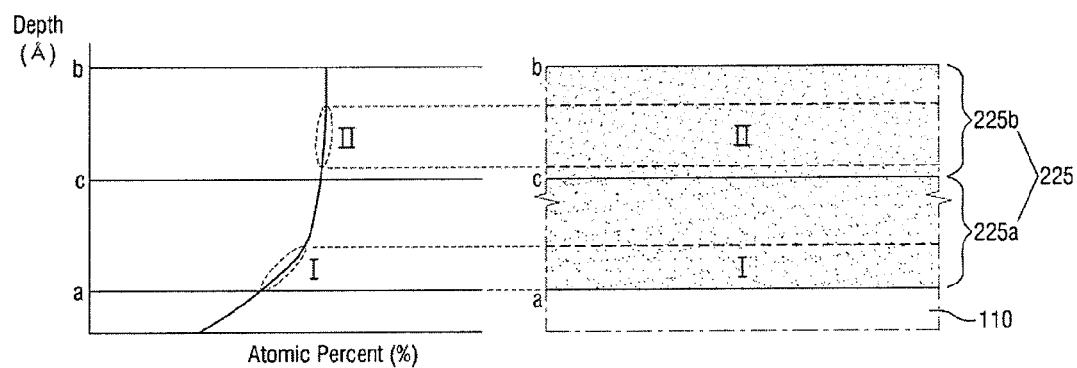
FIG. 17 illustrates a distribution of nitrogen atoms in a fifth insulating layer formed according to another embodiment of the present inventive concepts.

Hereinafter, a method for manufacturing a semiconductor device according to another embodiment of the present inventive concepts will be described with reference to FIGS. 14 to 17. The same functional components as those of the previous embodiment are denoted by the same reference numerals, and detailed descriptions thereof will not be repeated. FIGS. 14 to 16 are cross-sectional views illustrating process steps in the manufacturing method for a semiconductor device according to another embodiment of the present inventive concepts, and FIG. 17 illustrates a distribution of nitrogen atoms in a fifth insulating layer 225 formed according to another embodiment of the present inventive concepts.

Referring to the embodiment FIG. 14, unlike in the previous embodiment, a first insulating layer 221 having a double-layered structure consisting of a first silicon oxide layer 221a and a first high-k layer 221b is formed on a substrate 110. Since a sufficiently high dielectric constant can be attained by the high-k layer 221b, the thickness of the first insulating layer 221 of the current embodiment may be smaller than that of the first insulating layer 121 of the previous embodiment.

Referring to FIG. 15, a second insulating layer 222 is formed by simultaneously performing a first implantation 10 of a first group of nitrogen atoms 11 into both the silicon oxide layer 221a and the high-k layer 221b. Next, a third insulating layer is formed by performing a first anneal and a second anneal on the second insulating layer 222; and a fourth insulating layer is formed by further performing a second implantation of a second group of nitrogen atoms on the third insulating layer.

Referring to FIG. 16, a fifth insulating layer 225 is formed by performing a third anneal 50 and a fourth anneal 60 on the fourth insulating layer. The fifth insulating layer 225 includes a fifth silicon oxide layer 225a and a fifth high-k layer 225b formed on the fifth silicon oxide layer 225a.

The first implantation 10, the first anneal, the second anneal, the second implantation, the third anneal 50 and the fourth anneal 60 may be performed by the same methods as those of the previous embodiment; and detailed descriptions thereof will not be repeated. Through the above-described processes, nitrogen atoms are simultaneously implanted into both the silicon oxide layer 221a and the high-k layer 221b; and the silicon oxide layer 221a and the high-k layer 221b are simultaneously annealed.

A distribution of nitrogen atoms in the fifth insulating layer 225 formed according to this embodiment will be described with reference to FIG. 17. In FIG. 17, reference symbol "a" denotes a bottom surface of the fifth insulating layer 225, and reference symbol "b" denotes a top surface of the fifth insulating layer 225. In addition, "b" coincides with an interface between the substrate 110 and the fifth insulating layer 225, and "c" coincides with an interface between the fifth silicon oxide layer 225a and the fifth high-k layer 225b.

The fifth insulating layer 225 includes a first region I contacting the substrate 110 and a second region II. Here, the first region I and the second region II may be positioned irrespective of a location of the fifth silicon oxide layer 225a or the fifth high-k layer 225b. The number of nitrogen atoms in the first region I is smaller than the number of nitrogen atoms in the second region II. That is to say, the number of nitrogen atoms in the fifth insulating layer 225 decreases toward the substrate 110 away from the top surface "a." This distribution is the same as the nitrogen distribution shown in FIG. 12.

Although not shown, the distribution of nitrogen atoms in the fifth insulating layer 225 is the same as the distribution of nitrogen atoms in the previous embodiment shown in FIG. 13.

As described above, the fifth insulating layer 225 according to the current embodiment has a stacked structure including the fifth silicon oxide layer 225a and the fifth high-k layer 225b and exhibits the same nitrogen distribution as in the previous embodiment. The number of nitrogen atoms in the fifth insulating layer 225 is therefore reduced at the interface between the fifth insulating layer 225 and the substrate 110, thereby improving the NBTI lifetime characteristic.

Figure 18:
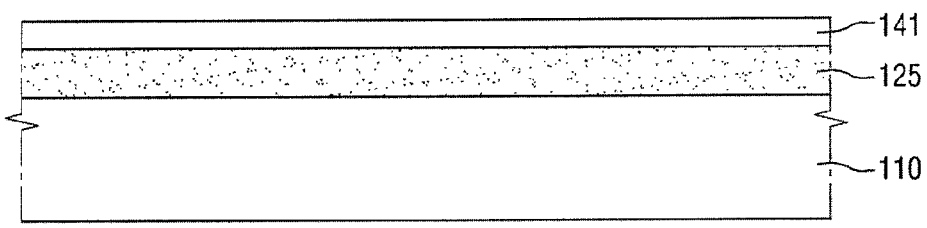
FIGS. 18 and 19 are cross-sectional views illustrating process steps in the method for manufacturing a semiconductor device according to still another embodiment of the present inventive concepts.
Figure 19:
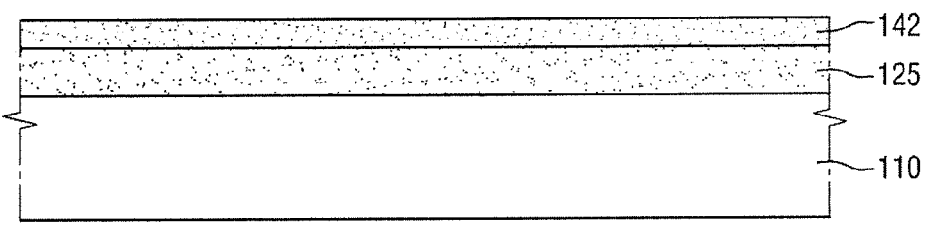

Hereinafter, a manufacturing method for a semiconductor device according to still another embodiment of the present inventive concepts will be described with reference to FIGS. 18 and 19. The same functional components as those of the previous embodiment are denoted by the same reference numerals, and detailed descriptions thereof will not be repeated. FIGS. 18 and 19 are cross-sectional views illustrating process steps in the manufacturing method for a semiconductor device according to still another embodiment of the present inventive concepts.

Referring to FIG. 18, in the manufacturing method for a semiconductor device according to still another embodiment of the present inventive concepts, a high-k layer 141 is formed on the fifth insulating layer 125 formed in the previous embodiment.

The high-k layer 141 may be formed by an atomic layer deposition (ALD) or a chemical vapor deposition (CVD) process.

Referring to FIG. 19, a second high-k layer 142 is formed by performing a first implantation of nitrogen atoms on the high-k layer 141. The first nitrogen implantation may be performed by plasma treatment or rapid thermal annealing. After the first nitrogen implantation, the second high-k layer 142 may be annealed. In addition, although not shown, like in the previous embodiment, a first anneal, a second anneal, a second nitrogen implantation, a third anneal and a fourth anneal may be performed after the forming of the second high-k layer 142.

Hereinafter, a manufacturing method for a semiconductor device according to still another embodiment of the present inventive concepts will be described with reference to FIGS. 20 to 25. The same functional components as those of the previous embodiment are denoted by the same reference numerals, and detailed descriptions thereof will not be repeated. FIGS. 20 to 25 are cross-sectional views illustrating process steps in the method for manufacturing a semiconductor device according to still another embodiment of the present inventive concepts.

Figure 20:
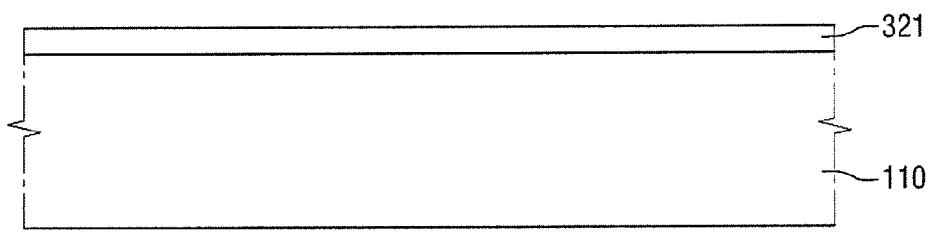
FIGS. 20 to 25 are cross-sectional views illustrating process steps in the method for manufacturing a semiconductor device according to still another embodiment of the present inventive concepts.

Referring to FIG. 20, an oxide layer 321 is formed on a substrate 110.

The oxide layer 321 may be a silicon oxide layer or a high-k layer and may have a single- or multiple-layered structure including the above stated layers. In addition, the oxide layer 321 may be a stacked layer including a silicon oxide layer and a high-k layer formed on the silicon oxide layer. FIG. 20 illustrates a case in which the oxide layer 321 has a single layered structure of a silicon oxide layer or a high-k layer. The oxide layer 321 may be formed by an ALD or CVD process.

Figure 21:
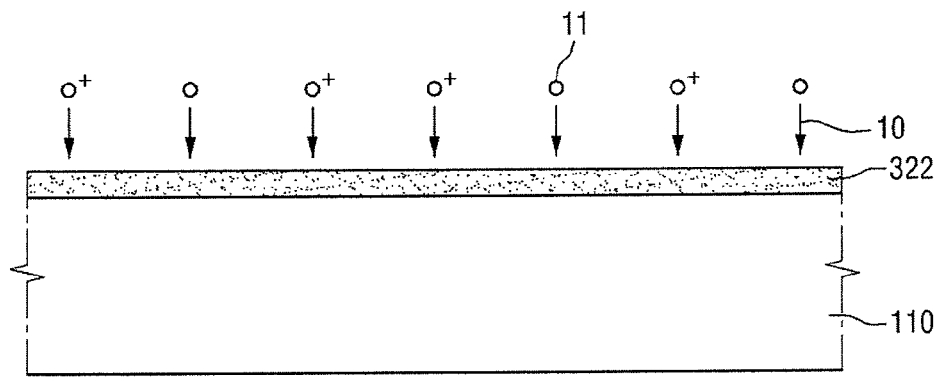

Referring to FIG. 21, a first nitride layer 322 is formed by performing a first implantation 10 of nitrogen atoms 11 into the oxide layer 321. Here, the first implantation 10 of the nitrogen atoms 11 may be performed by plasma treatment or rapid thermal annealing.

Figure 22:
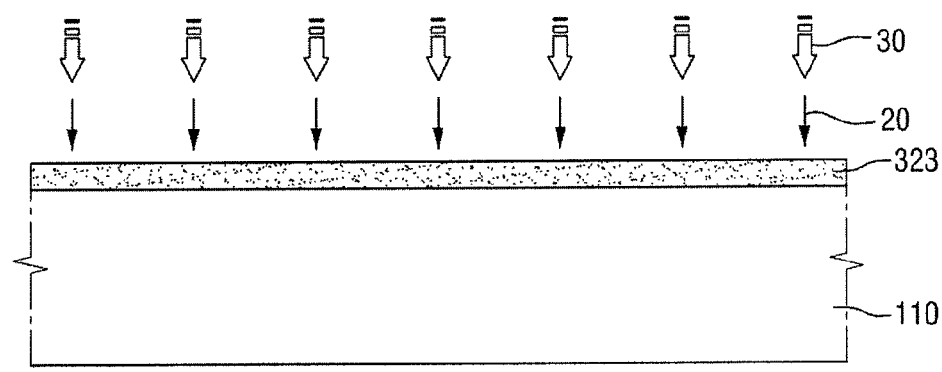

Referring to FIG. 22, a second nitride layer 323 is formed by sequentially performing a first anneal 20 and a second anneal 30 on the first nitride layer 322. The first anneal 20 is performed at a first temperature with a stream of a first gas, and the second anneal 30 is performed at a second temperature higher than the first temperature with a stream of a second gas different from the first gas. The first anneal 20 and the second anneal 30 may be performed in situ in the same chamber.

The first implantation 10 of the nitrogen atoms 11, the first anneal 20 and the second anneal 30 may be performed by the same methods as used in the processes S120 and S130 of the previous embodiment, and detailed descriptions thereof will not be repeated.

Figure 23:
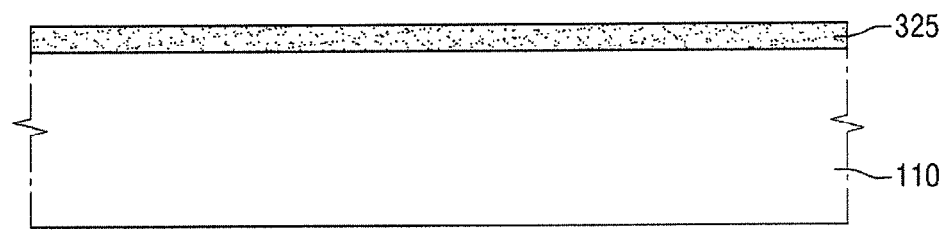

Referring to FIG. 23, a gate insulating layer 325 is formed by repeatedly performing the implantation 10 and the two anneals 20 and 30 on the second nitride layer 323 more than n times, where n is an integer greater than or equal to 1.

The repeated performance of the implantation 10 and the two anneals 20 and 30 may include repeatedly performing either n times or (n+1) times the implantation 10 and the two anneals 20 and 30 under the same conditions. Alternatively, the repeated performance of the implantation 10 and the two anneals 20 and 30 may also be performed under varying conditions. For example, the implantation 10 of the nitrogen atoms 11 may be performed by plasma treatment while applying a higher power source according to the number of repetitions. In addition, in a case where the number of repetitions is (n+1) times, the anneals 20 and anneal 30 for the $(n+1)^{th}$ time may be performed at a higher temperature respectively than each of the anneals for the $n^{th}$ time.

While the implantation 10 of the nitrogen atoms 11 and the two anneals 20 and 30 are repeatedly performed several times, the number of nitrogen atoms 11 present at the interface between a gate insulating layer 325 and the substrate 110, that is, at a region of the gate insulating layer 325 contacting the substrate 110, gradually decreases. Therefore, the NBTI lifetime characteristic of the semiconductor device manufactured according to the current embodiment can be improved.

Figure 24:
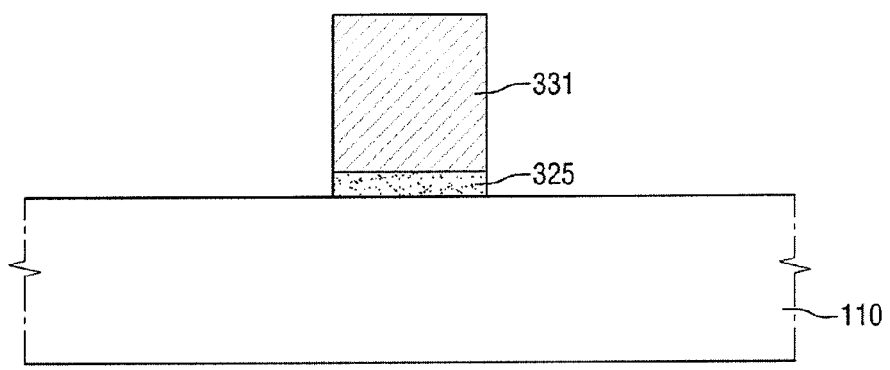

Referring to FIG. 24, a conductive layer for a gate electrode is formed on the gate insulating layer 325 and patterned by a photolithography process, thereby forming a gate pattern including the gate insulating layer 325 and a gate electrode 331.

Figure 25:
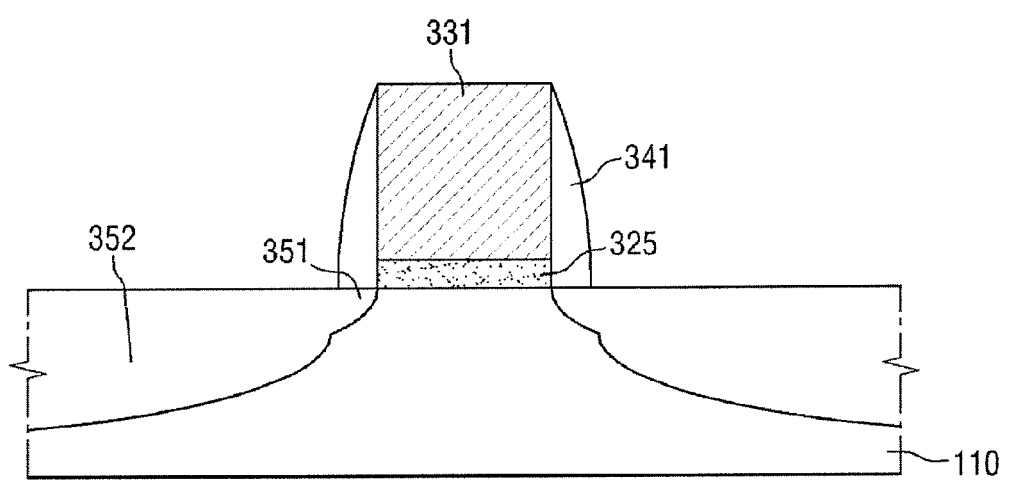

Referring to FIG. 25, a lightly doped impurity region 351, a gate spacer 341 and source and drain regions 352 are formed at opposite sides of the substrate 110 in view of the gate pattern. The lightly doped impurity region 351 is formed by implanting an impurity into the substrate 110 on both sides of the gate pattern. In detail, a region doped with impurity in a low concentration is formed by performing ion implantation using the gate pattern as a mask.

The impurity may be an n-type dopant, such as phosphorus (P) or arsenic (As), in the case of an NMOS region, or a p-type dopant, such as boron (B) or gallium (Ga), in the case of a PMOS region.

Next, the gate spacer 341 is formed on both sidewalls of the gate pattern. The gate spacer 341 may be formed of a silicon oxide layer or a silicon nitride layer. The gate spacer 341 may have a structure in which the silicon oxide layer and the silicon nitride layer are sequentially stacked. The source and drain regions 352 are formed by implanting the impurity into the entire surface of the substrate 110 using the gate pattern and the gate spacer 341 as masks.

Hereinafter, merits and advantageous effects that may be provided by embodiments of the present inventive concepts will be described in more detail through the following examples.

EXPERIMENTAL EXAMPLE 1

Evaluation of Nitrogen Concentration and NBTI Lifetime Characteristic (1) EXAMPLE 1

A silicon oxide layer was formed on a silicon substrate and a first implantation of nitrogen atoms was performed into the silicon oxide layer via plasma treatment by applying a power source of 500 W at 20 mTorr for 20 seconds.

Next, a first anneal was performed at 800° C. with a stream of nitrogen gas, and a second anneal was in-situ performed at 1000° C. with a stream of oxygen gas. Subsequently, a second implantation of nitrogen atoms was performed by plasma treatment with a power source of 2000 W applied at 20 mTorr for 20 seconds. Then, a third anneal was performed at 900° C. with a stream of nitrogen gas, and a fourth anneal was in-situ performed at 1100° C. with a stream of oxygen gas. As a result, an insulation layer is formed; the distribution of nitrogen atoms in the formed insulating layer is shown in FIG. 26, and the NBTI lifetime characteristic is shown in FIG. 27.

Figure 26:
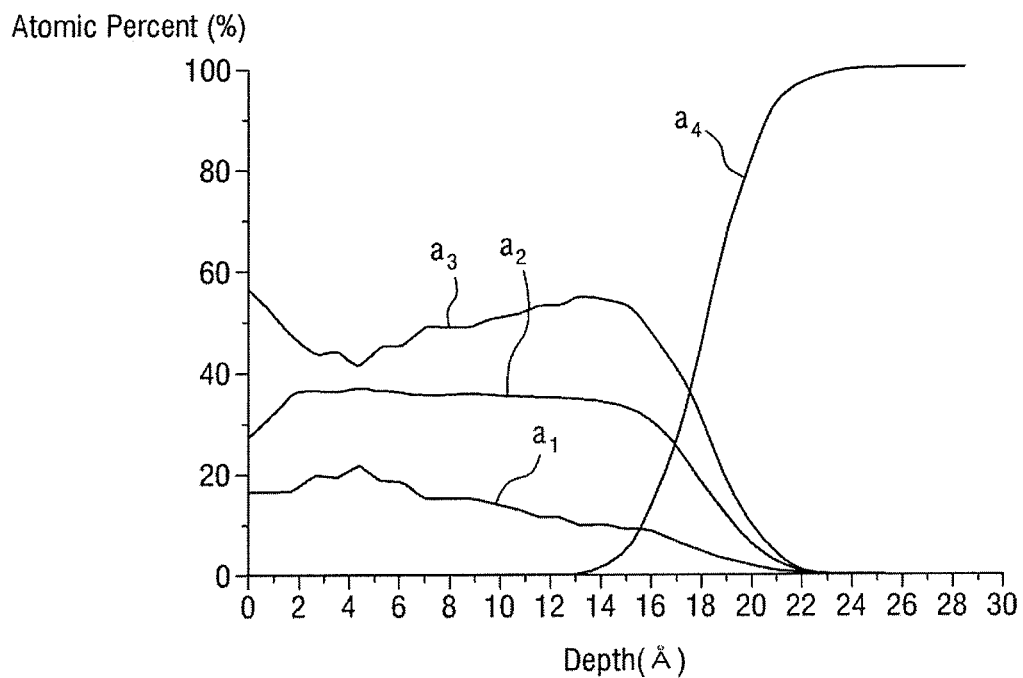
FIGS. 26 and 27 illustrate a distribution of nitrogen atoms and the NBTI lifetime characteristic in a fifth insulating layer formed according to Experimental Example 1-(1)

In FIG. 26, the abscissa indicates the depth (in A) range of the insulating layer from a top surface, and the ordinate indicates atomic percent (%) as a function of the depth. The curve $a_1$ indicates the depth-dependent nitrogen distribution; the curve $a_2$ indicates the silicon (Si) distribution in a silicon oxide layer; the curve $a_3$ indicates the oxygen distribution; and the curve $a_4$ indicates the silicon (Si) distribution in a silicon substrate. As indicated by the curve $a_1$ of FIG. 26, the number of nitrogen atoms present in the insulating layer gradually decreased toward the silicon substrate from the top surface of the insulating layer. In addition, the number of nitrogen atoms was smallest around 12 Å to 18 Å—that is, around the interface region between the silicon substrate and the insulating layer. The number of oxygen atoms gradually increased toward the interface region between the silicon substrate and the insulating layer.

Figure 27:
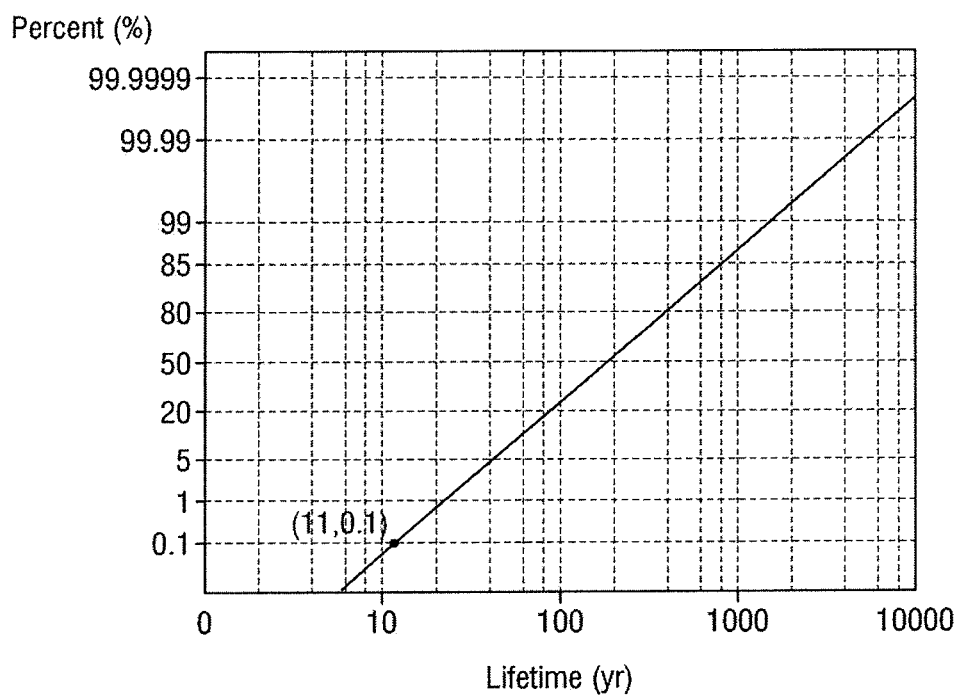

FIG. 27 illustrates the measured NBTI lifetime of an insulating layer formed in Experimental Example 1-(1). In FIG. 27, the abscissa indicates NBTI lifetime, and the ordinate indicates a lifetime cumulative probability distribution. As shown in FIG. 27, when the lifetime cumulative probability distribution was 0.1%, the NBTI lifetime of the insulating layer formed in Experimental Example 1-(1) was approximately 11.4 years.

(2) EXAMPLE 2

A silicon oxide layer was formed on a silicon substrate, and a first implantation of nitrogen atoms was performed into the silicon oxide layer via plasma treatment by applying a power source of 500 W at 20 mTorr for 20 seconds, followed by annealing at 1100° C. with a stream of nitrogen gas. Next, a second implantation of nitrogen atoms was performed by plasma treatment with a power source of 2000 W applied at 20 mTorr for 20 seconds, followed by annealing at 1100° C. with a stream of nitrogen gas. That is to say, an insulating layer was formed in the same manner as in Experimental Example 1-(1), except that the first anneal and the third anneal were performed at 1100° C. without performing the second anneal and the fourth anneal. As a result, a distribution of nitrogen atoms in the formed insulating layer is shown in FIG. 28, and the NBTI lifetime characteristic is shown in FIG. 29.

Figure 28:
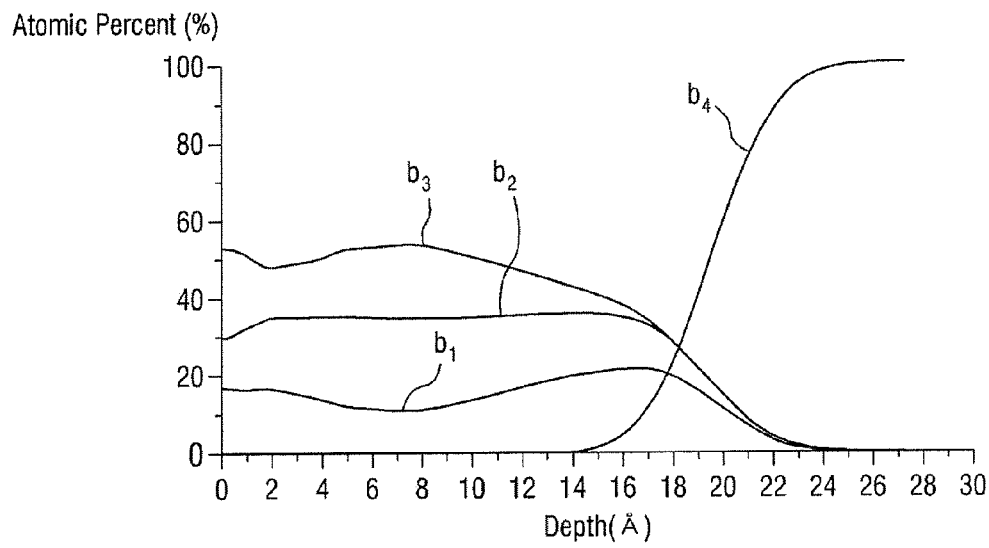
FIGS. 28 and 29 illustrate a distribution of nitrogen atoms and the NBTI lifetime characteristic in a fifth insulating layer formed in Experimental Example 1-(2).

FIG. 28 illustrates the atomic percent (%) as a function of the depth of the insulating layer formed in Experimental Example 1-(2). In FIG. 28, the curve $b_1$ indicates a depth-dependent nitrogen distribution from the top surface of the insulating layer; the curve $b_2$ indicates a silicon (Si) distribution in a silicon oxide layer; the curve $b_3$ indicates an oxygen distribution; and the curve $b_4$ indicates a silicon (Si) distribution in a silicon substrate. As indicated by the curve $b_1$ of FIG. 28, the number of nitrogen atoms present in the insulating layer gradually increased toward the silicon substrate from the center of the insulating layer. In addition, the number of nitrogen atoms increased around the range of depths from 12 Å to 18 Å—that is, around the interface region between the silicon substrate and the insulating layer.

Figure 29:
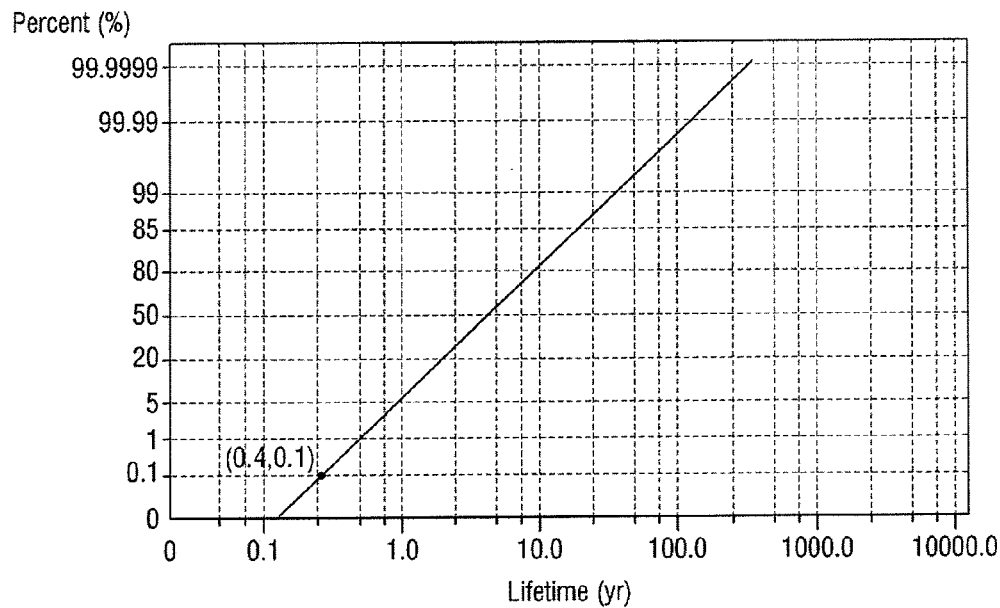

FIG. 29 illustrates the measured NBTI lifetime of the insulating layer formed in Experimental Example 1-(2). As shown in FIG. 29, when the lifetime cumulative probability distribution was 0.1%, the NBTI lifetime of the insulating layer formed in Experimental Example 1-(2) was approximately 0.4 years.

The insulating layer formed in Experimental Example 1-(2) demonstrated a noticeable reduction in the NBTI lifetime compared to the insulating layer formed in Experimental Example 1-(1).

As described above, the number of nitrogen atoms present in the insulating layer formed in Experimental Example 1-(1) was reduced around the interface between the insulating layer and the substrate. Accordingly, the insulating layer formed in Experimental Example 1-(1) demonstrated a noticeable increase in the NBTI lifetime compared to the insulating layer formed in Experimental Example 1-(2).

While embodiments of the present inventive concepts have been particularly shown and described, it will be understood by those of ordinary skill in the art that various changes in form and details may be made therein without departing from the spirit and scope of the present inventive concepts as defined by the following claims. It is therefore desired that the present embodiments be considered in all respects as illustrative and not restrictive, reference being made to the appended claims rather than the foregoing description to indicate the scope of the inventive concepts.

What is claimed is:

1. A method for manufacturing a semiconductor device comprising:
   forming a first insulating layer on a substrate;
   forming a second insulating layer by performing a first nitridation on the first insulating layer;
   forming a third insulating layer by sequentially performing a first anneal and a second anneal on the second insulating layer, the first anneal performed at a first temperature with a stream of a first gas, and the second anneal performed at a second temperature higher than the first temperature with a stream of a second gas different from the first gas;
   forming a fourth insulating layer by performing a second nitridation on the third insulating layer; and
   forming a fifth insulating layer by sequentially performing a third anneal and a fourth anneal on the fourth insulating layer, wherein the third anneal is performed at a third temperature higher than the first temperature with a stream of a third gas, and the fourth anneal is performed at a fourth temperature higher than the second temperature with a stream of a fourth gas different from the third gas.

2. The manufacturing method of claim 1, wherein the fifth insulating layer includes a first region and a second region, the first region contacting at least one surface of the fifth insulating layer and having a smaller number of nitrogen atoms than the second region.

3. The manufacturing method of claim 1, wherein the fifth insulating layer includes a first region and a second region, the first region positioned closer to the substrate than the second region and having a smaller number of nitrogen atoms than the second region.

4. The manufacturing method of claim 1, wherein the number of nitrogen atoms existing in the fifth insulating layer gradually increases with increasing distance from the substrate.

5. The manufacturing method of claim 4, wherein the first insulating layer is a stacked layer of an oxide layer and a high-k layer, and wherein the first nitridation, the first anneal and the second anneal, the second nitridation, the third anneal and the fourth anneal are performed on the stacked layer.

6. The manufacturing method of claim 1, further comprising forming a high-k layer on the fifth insulating layer.

7. The manufacturing method of claim 6, further comprising implanting nitrogen into the high-k layer.

8. The manufacturing method of claim 6, further comprising performing the first nitridation, the first anneal, the second anneal, the second nitridation, the third anneal, and the fourth anneal on the high-k layer.

9. The manufacturing method of claim 1, wherein the stream of the second gas and the stream of the fourth gas contain oxygen.

10. The manufacturing method of claim 1, wherein the first nitridation and the second nitridation are performed by plasma nitridation, and wherein the plasma nitridation in the second nitridation is performed with higher energy than in the first nitridation.

11. The manufacturing method of claim 1, wherein the first anneal and the second anneal are in-situ performed, and the third anneal and the fourth anneal are also in-situ performed.

12. A method for manufacturing a semiconductor device comprising:
    forming an oxide layer on a substrate;
    forming a first nitride layer by performing a first nitridation on the oxide layer;
    forming a second nitride layer by sequentially performing a first anneal and a second anneal on the first nitride layer, wherein the first anneal is performed at a first temperature with a stream of a first gas, and wherein the second anneal is performed at a second temperature higher than the first temperature with a stream of a second gas different from the first gas;
    forming a gate insulating layer by performing at least a second nitridation, a third anneal and a fourth anneal on the second nitride layer; and
    forming a gate electrode on the gate insulating layer.

13. The manufacturing method of claim 12, wherein a nitrogen concentration of the gate insulating layer becomes smallest at an interface between the gate insulating layer and the substrate.

14. The manufacturing method of claim 12, wherein the oxide layer is a stacked layer in which a high-k layer is stacked on the oxide layer, and wherein the gate insulating layer is formed by performing the first nitridation, the first anneal, the second anneal, the second nitridation, the third anneal, and the fourth anneal on the stacked layer.

15. The manufacturing method of claim 12, further comprising forming a high-k layer on the gate insulating layer after the forming of the gate insulating layer and before the forming of the gate electrode.

* * * * *